United States Patent
Lau et al.

(10) Patent No.: US 8,196,012 B2
(45) Date of Patent: Jun. 5, 2012

(54) METHOD AND SYSTEM FOR ENCODING AND DECODING LOW-DENSITY-PARITY-CHECK (LDPC) CODES

(75) Inventors: Chung Ming Lau, Hong Kong (CN); Wai Man Tam, Hong Kong (CN); Chi Kong Tse, Hong Kong (CN)

(73) Assignee: The Hong Kong Polytechnic University, Kowloon (HK)

( * ) Notice: Subject to any disclaimer, the term of this patent is extended or adjusted under 35 U.S.C. 154(b) by 452 days.

(21) Appl. No.: 12/573,577

(22) Filed: Oct. 5, 2009

(65) Prior Publication Data

US 2011/0083052 A1    Apr. 7, 2011

(51) Int. Cl.
  *H03M 13/00*    (2006.01)
(52) U.S. Cl. .......................... 714/758; 714/791; 714/793
(58) Field of Classification Search .................. 714/752, 714/791, 793, 758
  See application file for complete search history.

(56) References Cited

U.S. PATENT DOCUMENTS

| | | | |
|---|---|---|---|
| 7,162,684 B2 | 1/2007 | Hocevar | |
| 7,458,009 B2 | 11/2008 | Yu et al. | |
| 7,668,248 B2 * | 2/2010 | Hocevar | 375/260 |
| 7,992,066 B2 * | 8/2011 | Oh et al. | 714/752 |
| 8,020,063 B2 * | 9/2011 | Olaker et al. | 714/755 |
| 2004/0199860 A1 * | 10/2004 | Kim et al. | 714/801 |
| 2006/0242534 A1 | 10/2006 | Livshitz | |
| 2007/0094580 A1 | 4/2007 | Livshitz | |
| 2007/0136635 A1 | 6/2007 | Niu et al. | |
| 2007/0198905 A1 * | 8/2007 | Bhatt et al. | 714/801 |
| 2008/0168324 A1 | 7/2008 | Xu et al. | |
| 2008/0270867 A1 * | 10/2008 | Chung et al. | 714/752 |
| 2009/0019333 A1 * | 1/2009 | McEvoy et al. | 714/752 |
| 2010/0031116 A1 * | 2/2010 | Yoon et al. | 714/752 |
| 2010/0100789 A1 * | 4/2010 | Yu et al. | 714/752 |

FOREIGN PATENT DOCUMENTS

EP    1 667 328 A1    6/2006

OTHER PUBLICATIONS

Li Peng; Guangxi Zhu; , "Improving performance of some irregular LDPC codes by means of three optimization techniques," Global Mobile Congress 2009 , vol., No., pp. 1-5, Oct. 12-14, 2009.*
Wei Zhan; Guangxi Zhu; Li Peng; Xi Yan; , "Quasi-cyclic LDPC codes based on D and Q matrices through progressive edge growth," Intelligent Signal Processing and Communication Systems, 2007. ISPACS 2007. International Symposium on , vol., No., pp. 12-15, Nov. 28-Dec. 1, 2007.*
Paolini, E.; Chiani, M.; , "Construction of Near-Optimum Burst Erasure Correcting Low-Density Parity-Check Codes," Communications, IEEE Transactions on , vol. 57, No. 5, pp. 1320-1328, May 2009.*

(Continued)

*Primary Examiner* — Cynthia Britt
(74) *Attorney, Agent, or Firm* — Morrison & Foerster LLP

(57) ABSTRACT

An approximated lower-triangle structure for the parity-check matrix of low-density parity-check (LDPC) codes which allows linear-time-encoding complexity of the codes is disclosed, and the parity part of the parity-check matrix is semi-deterministic which allows high flexibility when designing the LDPC codes in order to provide higher error-correction capabilities than a typical dual-diagonal structure.

19 Claims, 10 Drawing Sheets

OTHER PUBLICATIONS

Selvarathinam, A.; Choi, G.; , "Tiling parity-check matrix for reduced complexity high throughput low-density parity-check decoders," Signal Processing Systems Design and Implementation, 2005. IEEE Workshop on , vol., No., pp. 744-749, Nov. 2-4, 2005.*

T. Richardson, et al. (Feb. 2001). "Efficient encoding of low-density parity check codes", *IEEE Transactions on Information Theory* 47(2):638-656.

S. Myung, et al. (Aug. 2005). "Quasi-cyclic LDPC codes for fast encoding", *IEEE Transactions on Information Theory* 51(8):2894-2901.

IEEE 802.16e, "IEEE Standard for Local Metropolitan Area Networks. Part 16: Air Interface for Fixed and Mobile Broadband Wireless Access Systems, Amendment 2: Physical and Medium Access Control Layers for Combined Fixed and Moble Operation in Licensed Bands", *IEEE Standard 802. 16e-2005*, Feb. 28, 2006.; pp. 626-630.

Z. Cai, et al. (Dec. 7, 2006). "Efficient encoding of IEEE 802.11n LDPC codes", *Electronics Letters* 42(25):1471-1472.

J.M. Perez, et al. (Feb. 4, 2008). "Low-cost encoding of IEEE 802.11n", *Electronics Letters* 44(4):307-308.

IEEE P802.11n/D1.0, "Draft IEEE Standard for Local Metropolitan networks—Specific requirements. Part 11: Wireless LAN Medium Access Control (MAC), and Physical Layer (PHY) specifications: Enhancements for Higher Throughput", Jun. 2009.; pp. 293-295; 512-514.

* cited by examiner (Prior Art)

(Prior Art)

Figure 6

| Column number | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| A code | 3 | 3 | 6 | 3 | 3 | 6 | 3 | 6 | 3 | 6 | 3 | 6 | 3 | 2 | 2 | 2 | 2 | 2 | 2 | 2 | 2 | 2 | 2 | 2 |
| B code | 3 | 3 | 8 | 3 | 3 | 8 | 3 | 8 | 3 | 8 | 3 | 8 | 3 | 2 | 2 | 2 | 2 | 2 | 2 | 2 | 2 | 2 | 2 | 2 |
| IEEE 802.16e | 3 | 3 | 6 | 3 | 3 | 6 | 3 | 6 | 3 | 6 | 3 | 6 | 3 | 2 | 2 | 2 | 2 | 2 | 2 | 2 | 2 | 2 | 2 | 2 |

Figure 7

| Row number | 0 | 1 | 2 | 3 | 4 | 5 | 6 | 7 | 8 | 9 | 10 | 11 | |
|---|---|---|---|---|---|---|---|---|---|---|---|---|---|
| $H_{b1}$ | 5 | 6 | 5 | 5 | 6 | 5 | 4 | 4 | 4 | 3 | 3 | 1 | non-uniform row weights |
| $H_{b2}$ | 1 | 1 | 1 | 1 | 1 | 1 | 3 | 2 | 2 | 3 | 4 | 5 | non-uniform row weights |
| $H_b$ | 6 | 7 | 6 | 6 | 7 | 6 | 7 | 6 | 6 | 6 | 7 | 6 | nearly-uniform row weights |

Figure 8

| Row number | 0 | 1 | 2 | 3 | 4 | 5 | 6 | 7 | 8 | 9 | 10 | 11 | |
|---|---|---|---|---|---|---|---|---|---|---|---|---|---|
| $H_{b1}$ | 4 | 5 | 5 | 4 | 4 | 4 | 4 | 4 | 5 | 4 | 4 | 4 | nearly-uniform row weights |
| $H_{b2}$ | 2 | 2 | 2 | 2 | 2 | 3 | 2 | 2 | 2 | 2 | 2 | 2 | nearly-uniform row weights |
| $H_b$ | 6 | 7 | 7 | 6 | 6 | 7 | 6 | 6 | 7 | 6 | 6 | 6 | nearly-uniform row weights |

Figure 10

| codeword Index | d0 0 | d1 1 | d2 2 | d3 3 | d4 4 | d5 5 | p0 6 | p1 7 | p2 8 | p3 9 | p4 10 | p5 11 |
|---|---|---|---|---|---|---|---|---|---|---|---|---|
| 0 | h00 |  |  | h03 |  |  |  | - |  |  |  |  |
| 1 |  |  | h22 |  | h14 | h15 |  |  | - |  |  |  |
| 2 | h20 |  |  |  |  |  |  | h27 |  | - |  |  |
| 3 |  | h31 |  | h33 |  |  | P |  |  |  | - |  |
| 4 |  |  | h42 |  |  |  | - |  |  | h49 | - | - |
| 5 |  |  |  |  |  | h55 | P |  | h58 |  |  | - |

Figure 11

| addition | 0 | 1 |
|---|---|---|
| 0 | 0 | 1 |
| 1 | 1 | 0 |

Figure 12

| multiplication | 0 | 1 |
|---|---|---|
| 0 | 0 | 0 |
| 1 | 0 | 1 |

Figure 13

A code

| index | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| 1 | -1 | -1 | 35 | -1 | -1 | 70 | -1 | 9 | -1 | 32 | -1 | 39 | -1 | 0 | -1 | -1 | -1 | -1 | -1 | -1 | -1 | -1 | -1 | -1 |
| 2 | -1 | 23 | 17 | 64 | -1 | -1 | -1 | -1 | 15 | 87 | -1 | 14 | -1 | -1 | 0 | -1 | -1 | -1 | -1 | -1 | -1 | -1 | -1 | -1 |
| 3 | -1 | -1 | 6 | -1 | 12 | -1 | -1 | 83 | 73 | 0 | -1 | -1 | -1 | -1 | -1 | 0 | -1 | -1 | -1 | -1 | -1 | -1 | -1 | -1 |
| 4 | 17 | 25 | -1 | -1 | 90 | -1 | 27 | 64 | -1 | -1 | -1 | -1 | -1 | -1 | -1 | -1 | 0 | -1 | -1 | -1 | -1 | -1 | -1 | -1 |
| 5 | -1 | -1 | 21 | 86 | -1 | -1 | 83 | 14 | -1 | 20 | 67 | -1 | -1 | -1 | -1 | -1 | -1 | 0 | -1 | -1 | -1 | -1 | -1 | -1 |
| 6 | 20 | -1 | -1 | 0 | -1 | 11 | -1 | -1 | -1 | 10 | -1 | -1 | -1 | -1 | -1 | -1 | -1 | 14 | -1 | -1 | -1 | -1 | -1 | -1 |
| 7 | 52 | -1 | 45 | -1 | -1 | 93 | -1 | -1 | 18 | -1 | 58 | 54 | -1 | 2 | -1 | 44 | -1 | -1 | 0 | -1 | -1 | -1 | -1 | -1 |
| 8 | -1 | -1 | 34 | -1 | 80 | 29 | 63 | 18 | -1 | -1 | -1 | 19 | 1 | -1 | -1 | -1 | 78 | -1 | -1 | 0 | -1 | -1 | -1 | -1 |
| 9 | -1 | -1 | -1 | -1 | -1 | 52 | -1 | -1 | -1 | 83 | -1 | -1 | 0 | -1 | -1 | -1 | -1 | -1 | -1 | -1 | 0 | -1 | -1 | -1 |
| 10 | -1 | 0 | -1 | -1 | -1 | 36 | -1 | -1 | -1 | -1 | 16 | 80 | 1 | -1 | -1 | -1 | -1 | -1 | 48 | -1 | -1 | 29 | 0 | -1 |
| 11 | -1 | -1 | -1 | -1 | -1 | -1 | -1 | -1 | -1 | -1 | -1 | 50 | -1 | -1 | 78 | -1 | -1 | -1 | -1 | 21 | 13 | -1 | 0 | 0 |
| 12 | -1 | -1 | -1 | -1 | -1 | -1 | -1 | 72 | -1 | -1 | -1 | -1 | -1 | -1 | -1 | -1 | -1 | -1 | -1 | -1 | -1 | -1 | -1 | 0 |

Figure 14

| B code index | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| 1 | -1 | -1 | 53 | 86 | -1 | 81 | -1 | 55 | -1 | -1 | 48 | 95 | -1 | 0 | -1 | -1 | -1 | -1 | -1 | -1 | -1 | -1 | -1 | -1 |
| 2 | -1 | 19 | 23 | 85 | -1 | -1 | 45 | -1 | -1 | 51 | -1 | 35 | -1 | -1 | 0 | -1 | -1 | -1 | -1 | -1 | -1 | -1 | -1 | -1 |
| 3 | -1 | -1 | 80 | -1 | 74 | 13 | 26 | 40 | -1 | 92 | -1 | -1 | -1 | -1 | -1 | 0 | -1 | -1 | -1 | -1 | -1 | -1 | -1 | -1 |
| 4 | -1 | -1 | 19 | -1 | -1 | 70 | -1 | 28 | -1 | 4 | 5 | 66 | -1 | -1 | -1 | -1 | 0 | -1 | -1 | -1 | -1 | -1 | -1 | -1 |
| 5 | 42 | 71 | -1 | -1 | -1 | 29 | -1 | -1 | -1 | 31 | -1 | -1 | -1 | -1 | 26 | 50 | -1 | 0 | -1 | -1 | -1 | -1 | -1 | -1 |
| 6 | 37 | -1 | 10 | -1 | -1 | -1 | -1 | 88 | 82 | 53 | -1 | 90 | -1 | -1 | -1 | -1 | -1 | -1 | 0 | -1 | -1 | -1 | -1 | -1 |
| 7 | -1 | -1 | 67 | -1 | -1 | 25 | -1 | 39 | -1 | 94 | 48 | 29 | -1 | -1 | -1 | -1 | -1 | -1 | -1 | 0 | -1 | -1 | -1 | -1 |
| 8 | -1 | -1 | 92 | -1 | -1 | 31 | 0 | 16 | -1 | 64 | -1 | 10 | -1 | -1 | -1 | -1 | -1 | -1 | -1 | -1 | 0 | -1 | -1 | -1 |
| 9 | -1 | -1 | 83 | 67 | 89 | 3 | -1 | 34 | 68 | -1 | -1 | 3 | -1 | -1 | -1 | -1 | -1 | 72 | 65 | -1 | -1 | -1 | -1 | -1 |
| 10 | -1 | -1 | -1 | -1 | -1 | 24 | -1 | -1 | 8 | -1 | -1 | -1 | 0 | -1 | -1 | -1 | -1 | -1 | -1 | -1 | -1 | 45 | 0 | -1 |
| 11 | 79 | -1 | -1 | -1 | -1 | -1 | -1 | 61 | -1 | -1 | -1 | 71 | -1 | 91 | -1 | -1 | -1 | -1 | -1 | -1 | -1 | -1 | 0 | 0 |
| 12 | -1 | 90 | -1 | -1 | 30 | -1 | -1 | -1 | -1 | 24 | -1 | -1 | -1 | -1 | -1 | -1 | 57 | -1 | -1 | 73 | 77 | -1 | -1 | 0 | ns
METHOD AND SYSTEM FOR ENCODING AND DECODING LOW-DENSITY-PARITY-CHECK (LDPC) CODES

TECHNICAL FIELD

The invention concerns a method and system for encoding and decoding low-density-parity-check (LDPC) codes.

BACKGROUND OF THE INVENTION

In a typical wireless communication system, error correction is introduced to address the problem of distortion caused by the communication channel. Low-density parity-check (LDPC) codes form a class of error-correcting codes. With the near-Shannon-limit performance, LDPC codes have become promising candidate codes for current and future-generation wireless systems. For example, they have been adopted for wireless local area network (WLAN), wireless metropolitan area networks (WMAN) and satellite TV in IEEE 802.11n, IEEE 802.16e (WiMAX) and DVB-S2 standards, respectively. In addition, LDPC codes can be used in data storage for encoding and decoding data.

FIG. 1 depicts a fundamental communication system using LDPC codes. The k data bits $\{d_0, d_1, \ldots, d_{k-1}\}$ are first passed to the LDPC encoder 10. For a given m×n parity-check matrix H 11, m redundant bits $\{p_0, p_1, \ldots, p_{m-1}\}$ are evaluated based on the data bits and then taken as the parity bits. A codeword c with length n (n=k+m) is subsequently formed by the k data bits and the m parity bits. After that, modulation 12 is performed before data transmission via the communication channel 13. After demodulation 14, based on the received signals, the LDPC decoder 15 estimates the data bits by finding a codeword ĉ such that Hĉ$^T$=0, where T represents the transpose operator that interchanges the columns and rows. After the transpose operation, the element in the i$^{th}$ row and j$^{th}$ column of the original matrix will become the element in the i$^{th}$ column and j$^{th}$ row of the new matrix.

Referring to FIG. 1, the design of the LDPC coding system involves the generation of the parity-check matrix H 11, and the implementations of the encoder 10 and the decoder 15. If there are no hardware constraints, the simplest method to create a sparse parity-check matrix H is to place 1's randomly and sparsely in H. However, in order to evaluate the generator matrix G with GH$^T$=0, Gaussian elimination needs to be performed to convert H into the systematic form $H_{sys}$=[Q|I], where Q is an m×k matrix and I is an m×m identity matrix with 1's on the diagonal and 0's elsewhere, such that the generator matrix G=[I|Q$^T$] can be found. Therefore, if H is constructed randomly, after the transformation, the sparseness of the original parity-check matrix H will disappear in the resulting matrix $H_{sys}$. Also, the resulting matrix $H_{sys}$ may not have m independent rows. To overcome these problems, H is often established directly in some specific forms. For example, in the publication by Li et al., "Low density parity check codes with semi-random parity check matrix", Electronics Letters, Vol. 35, No. 1, January 1999, pp. 38-39, H is divided into two sparse matrices $H_1$ and $H_2$. H=[$H_1$|$H_2$] where $H_1$ is an m×k matrix corresponding to the data bits of the codeword and $H_2$ is a full-rank m×m matrix corresponding to the parity bits. The systematic generator matrix for the encoder to generate the redundant bits is obtained by $G_{sys}$=[I|$H_1 H_2^{-T}$]. Since $G_{sys}$ is not sparse, evaluating the redundant bits using $G_{sys}$ directly involves a lot of computations. Alternatively, if the matrix $H_2$ can be constructed in a lower triangular form, the parity part of the codeword $p_i$, i=0, 1, ..., m−1, can be solved recursively such that the evaluation of the generator matrix $G_{sys}$ will be unnecessary. Generally, $H_2$ is taken to be a dual-diagonal matrix with non-zero elements located on the dual diagonal and zero elsewhere, and is given by:

$$H_2 = \begin{bmatrix} 1 & 0 & 0 & 0 & 0 & \cdots & 0 & 0 & 0 \\ 1 & 1 & 0 & 0 & 0 & \cdots & 0 & 0 & 0 \\ 0 & 1 & 1 & 0 & 0 & \cdots & 0 & 0 & 0 \\ 0 & 0 & 1 & 1 & 0 & \cdots & 0 & 0 & 0 \\ \vdots & \vdots & \vdots & \vdots & \vdots & \ddots & \vdots & \vdots & \vdots \\ 0 & 0 & 0 & 0 & 0 & \cdots & 1 & 0 & 0 \\ 0 & 0 & 0 & 0 & 0 & \cdots & 1 & 1 & 0 \\ 0 & 0 & 0 & 0 & 0 & \cdots & 0 & 1 & 1 \end{bmatrix}. \quad (1)$$

The weight of a column is defined as the number of non-zero entries in a column. In the matrix $H_2$ in Equation (1), all columns have a weight of two except the last column which has a weight of one.

To further facilitate the implementations of the encoder and the decoder, block-structured LDPC codes are considered for practical applications. A block-structured LDPC code is represented by a "base parity-check matrix" $H_b$, in which each element is a square sub-block matrix of size z by z, and z is an integer defined as the expansion factor. Compared with the parity-check matrix H, a base parity-check matrix $H_b$ has a much smaller size (reduced by z times z) and therefore requires much less memory for storage. Furthermore, a base matrix $H_b$ can be easily and flexibly expanded to a parity-check matrix H for different code lengths by using sub-block matrices with appropriate sizes.

Referring to FIG. 2, the structure of an LDPC code consisting of sub-block matrices is shown. Each of the sub-block matrices is a square sub-block matrix of size z by z. For the data portion $H_1$ of the parity-check matrix, each of the sub-block matrices inside can be a zero matrix 0, an identity matrix I or a permutation matrix P. For the parity portion $H_2$ of the parity-check matrix, each of the sub-block matrices in the lower triangular area 20 can be a zero matrix 0, an identity matrix I or a permutation matrix P while the sub-block matrices 21 not in the lower triangular area 20 must be zero matrices 0. All sub-block matrices on the diagonal 22 of $H_2$ are identity matrices I. Except the last sub-block column 23 which contains only one non-zero sub-block matrix, each of the other sub-block columns in $H_2$ contains two or more non-zero sub-block matrices. The fully-expanded matrix $H_2$ exists when the sub-block matrices are replaced by actual 0's and 1's. The last z columns in the fully-expanded matrix $H_2$ have weights of one. This is undesirable, particularly for a large value of z, because the larger the number of columns with a weight of one, the worse the error-correction capability of the LDPC code. To avoid the existence of a large number of columns with a weight of one in the fully-expanded matrix $H_2$, the structure of $H_2$ in FIG. 2 should be modified.

Referring to FIG. 3, another structure of an LDPC code consisting of sub-block matrices is shown. The dual-diagonal 30 structure of $H_2$ contains sub-block matrices, except the first sub-block column which contains three non-zero sub-block matrices 31 (each individual column inside the first sub-block column when $H_2$ is fully-expanded will then have a weight of three), all other sub-block columns contain two non-zero sub-block matrices (each individual column inside these sub-block columns when $H_2$ is fully-expanded will then have a weight of two). For the sub-block columns containing two non-zero sub-block matrices, the non-zero sub-block matrices are located at the dual-diagonal 30 positions of $H_2$ (as in FIG. 3) and are commonly fixed as identity matrices I.

Depending on the uniform (constant) or non-uniform (non-constant) weights of the parity-check matrix H, the LDPC codes can be classified into regular or irregular codes. The regular codes have constant column weight and constant row weight, whereas the irregular codes are characterized by unequal column weights and/or unequal row weights.

In the prior art it has been shown that in terms of error performance, the optimal column weights should be non-uniform while the row weights should be nearly-uniform with only two or three consecutive weight values. Therefore, to achieve a lower error rate, a parity-check matrix H with non-uniform column weights and nearly-uniform row weights is preferred. Consider the case when H is expressed in the form $H=[H_1|H_2]$. Then, the column weights of $H_1$ and/or $H_2$ should be non-uniform. When both the column weights of $H_1$ and $H_2$ are uniform, they should then be unequal. Furthermore, the row weights of $H_1$, $H_2$ and H are usually designed to be as uniform as possible. An example of an LDPC code with such features is shown in FIG. 3, which has been presented in the IEEE 802.16e standard. In FIG. 3, the column weights of $H_1$ are non-uniform and those of $H_2$ 32 are nearly-uniform. The row weights of all $H_1$, $H_2$ and $H=[H_1|H_2]$ are nearly-uniform.

Also in FIG. 3, the parity portion 32 of the parity-check matrix is in a completely deterministic form for all the columns which have a weight of two.

SUMMARY OF THE INVENTION

In a first aspect, there is provided a method for encoding data, the method comprising:

creating m parity bits from k data bits based on a parity-check matrix (H), the parity-check matrix (H) including a data portion ($H_1$) and a parity portion ($H_2$), the parity portion ($H_2$) includes sub-block matrices, each sub-block matrix being any one from the group consisting of: zero matrix, identity matrix and permutation matrix; and forming a codeword containing the k data bits and the created m parity bits;

wherein an upper diagonal is defined in the parity portion starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices;

each column from the second column to the third last column of the parity portion contains one or more identity matrices or permutation matrices below the upper diagonal, and the remaining sub-block matrices in the same column below the upper diagonal are zero matrices;

the last three sub-block matrices ($P_1$, $P_2$, $P_3$) in the first column of the parity portion are identity matrices or permutation matrices and at least two of the last three matrices are the same, and the remaining sub-block matrices in the first column of the parity portion are zero matrices;

in the second last column of the parity portion, the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and the last two sub-block matrices ($P_7$) in the last column of the parity portion are the same, and are identity matrices or permutation matrices.

Each column from the second column to the third last column of the parity portion may contain only one identity matrix or permutation matrix below the upper diagonal, and the remaining sub-block matrices in the same column below the upper diagonal are zero matrices.

The permutation matrices may be cyclic-right-shifted identity matrices.

In a second aspect, there is provided a method for computing m parity bits using k data bits and a parity-check matrix (H) including a data portion ($H_1$) and a parity portion ($H_2$) by finding vectors $p_0, p_1, \ldots, p_{m_b-1}$ each of length z based on vectors $d_0, d_1, \ldots, d_{k_b-1}$ each of length z, where $m_b$ is equal to m divided by z, and $k_b$ is equal to k divided by z, the parity-check matrix (H) having the following structure:

$$H = \begin{bmatrix} h_{0,0} & h_{0,1} & \cdots & h_{0,k_b-1} & 0 & h_{0,k_b+1} & 0 & \cdots & 0 & 0 & 0 \\ h_{1,0} & h_{1,1} & \cdots & h_{1,k_b-1} & 0 & h_{1,k_b+1} & h_{1,k_b+2} & \cdots & 0 & 0 & 0 \\ h_{2,0} & h_{2,1} & \cdots & h_{2,k_b-1} & 0 & h_{2,k_b+1} & h_{2,k_b+2} & \cdots & 0 & 0 & 0 \\ \vdots & \vdots & \ddots & \vdots & \vdots & \vdots & \vdots & \ddots & \vdots & \vdots & \vdots \\ h_{m_b-4,0} & h_{m_b-4,1} & \cdots & h_{m_b-4,k_b-1} & 0 & h_{m_b-4,k_b+1} & h_{m_b-4,k_b+2} & \cdots & h_{m_b-4,k_b+m_b-3} & 0 & 0 \\ h_{m_b-3,0} & h_{m_b-3,1} & \cdots & h_{m_b-3,k_b-1} & P_1 & h_{m_b-3,k_b+1} & h_{m_b-3,k_b+2} & \cdots & h_{m_b-3,k_b+m_b-3} & P_4 & 0 \\ h_{m_b-2,0} & h_{m_b-2,1} & \cdots & h_{m_b-2,k_b-1} & P_2 & h_{m_b-2,k_b+1} & h_{m_b-2,k_b+2} & \cdots & h_{m_b-2,k_b+m_b-3} & P_5 & P_7 \\ h_{m_b-1,0} & h_{m_b-1,1} & \cdots & h_{m_b-1,k_b-1} & P_3 & h_{m_b-1,k_b+1} & h_{m_b-1,k_b+2} & \cdots & h_{m_b-1,k_b+m_b-3} & P_6 & P_7 \end{bmatrix}$$

the method comprising:

calculating $p_1$ using the equation:

$$\sum_{j=0}^{k_b-1} h_{0,j} d_j + h_{0,k_b+1} p_1 = 0$$

calculating $p_2$ using the equation:

$$\sum_{j=0}^{k_b-1} h_{1,j} d_j + h_{1,k_b+1} p_1 + h_{1,k_b+2} p_2 = 0$$

calculating $p_{i+1}$ using the equation for $2 \leq i \leq m_b-4$:

$$\sum_{j=0}^{k_b-1} h_{i,j} d_j + \sum_{j=k_b+1}^{k_b+i} h_{i,j} p_{j-k_b} + h_{i,k_b+i+1} p_{i+1} = 0$$

calculating $P_0$ by using the equation:

$$\sum_{i=m_b-3}^{m_b-1} \left( \sum_{j=0}^{k_b-1} h_{i,j} d_j + \sum_{j=k_b+1}^{k_b+m_b-3} h_{i,j} p_{j-k_b} \right) +$$

$$(P_1 + P_2 + P_3) p_0 + (P_4 + P_5 + P_6) p_{m_b-2} = 0$$

calculating $p_{m_b-2}$ using the equation:

$$\sum_{j=0}^{k_b-1} h_{m_b-3,j} d_j + P_1 p_0 + \sum_{j=k_b+1}^{k_b+m_b-3} h_{m_b-3,j} p_{j-k_b} + P_4 p_{m_b-2} = 0;$$

and
calculating $p_{m_b-1}$ using the equation:

$$\sum_{j=0}^{k_b-1} h_{m_b-2,j} d_j + P_2 p_0 + \sum_{j=k_b+1}^{k_b+m_b-3} h_{m_b-2,j} p_{j-k_b} + P_5 p_{m_b-2} + P_7 p_{m_b-1} = 0;$$

wherein each element of the parity-check matrix is a sub-block matrix of size z by z, and is any one from the group consisting of: zero matrix, identity matrix and permutation matrix; the data portion ($H_1$) is composed of the first $k_b$ last columns of the parity-check matrix (H) and the parity portion ($H_2$) is composed of the remaining $m_b$ columns of the parity-check matrix (H);

an upper diagonal is defined in the parity portion ($H_2$) starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices; and each column from the second column to the third last column of the parity portion contains one or more identity matrices or permutation matrices below the upper diagonal, and the remaining sub-block matrices in the same column below the upper diagonal are zero matrices.

$p_{m_b-1}$ may be calculated using the equation:

$$\sum_{j=0}^{k_b-1} h_{m_b-1,j} d_j + P_3 p_0 + \sum_{j=k_b+1}^{k_b+m_b-3} h_{m_b-1,j} p_{j-k_b} + P_6 p_{m_b-2} + P_7 p_{m_b-1} = 0$$

The parity-check matrix (H) may be created by:
assigning identity matrices or permutation matrices to the last three sub-block matrices ($P_1, P_2, P_3$) in the first column of the parity portion ($H_2$) such that at least two of the last three sub-block matrices are the same;

assigning an identity matrix or a permutation matrix to each sub-block matrix on the upper diagonal in the parity portion ($H_2$);

assigning an identity matrix or a permutation matrix to at least one of the sub-block matrices below the upper diagonal for each column from the second column to the third last column of the parity portion ($H_2$);

assigning identity matrices or permutation matrices to the last three sub-block matrices in the second last column of the parity portion ($H_2$) such that the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and assigning the last sub-block matrix in the last column of the parity portion ($H_2$) to be the same as the second last sub-block matrix; and assigning zero matrices to all the remaining sub-block matrices in the parity portion ($H_2$); and assigning a zero matrix, an identity matrix or a permutation matrix to each of the sub-block matrices in the data portion ($H_1$).

An identity matrix or a permutation matrix may be assigned to only one of the sub-block matrices below the upper diagonal for each column from the second column to the third last column of the parity portion ($H_2$).

The permutation matrices may be cyclic-right-shifted identity matrices.

In a third aspect, there is provided a method for decoding data, the method comprising:
receiving signals representing a codeword of k+m bits;
decoding the k data bits using a parity-check matrix (H), the parity-check matrix including a data portion ($H_1$) and a parity portion ($H_2$), the parity portion ($H_2$) includes sub-block matrices, each sub-block matrix being any one from the group consisting of: zero matrix, identity matrix and permutation matrix;

wherein an upper diagonal is defined in the parity portion starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices;

each column from the second column to the third last column of the parity portion contains one or more identity matrices or permutation matrices below the upper diagonal, and the remaining sub-block matrices in the same column below the upper diagonal are zero matrices;

the last three sub-block matrices ($P_1, P_2, P_3$) in the first column of the parity portion are identity matrices or permutation matrices and at least two of the last three matrices are the same, and the remaining sub-block matrices in the first column of the parity portion are zero matrices;

in the second last column of the parity portion, the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and the last two sub-block matrices ($P_7$) in the last column of the parity portion are the same, and are identity matrices or permutation matrices.

Each column from the second column to the third last column of the parity portion may contain only one identity matrix or permutation matrix below the upper diagonal, and the remaining sub-block matrices in the same column below the upper diagonal are zero matrices.

The permutation matrices may be cyclic-right-shifted identity matrices.

In a fourth aspect, there is provided a system for encoding data, the system comprising:
an encoder to form a codeword containing k data bits and m parity bits created from the k data bits based on a parity-check matrix (H), the parity-check matrix (H) including a data portion ($H_1$) and a parity portion ($H_2$), the parity portion ($H_2$) includes sub-block matrices, each sub-block matrix being any one from the group consisting of: zero matrix, identity matrix and permutation matrix;

wherein an upper diagonal is defined in the parity portion starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices;

each column from the second column to the third last column of the parity portion contains one or more identity matrices or permutation matrices below the upper diagonal, and the remaining sub-block matrices in the same column below the upper diagonal are zero matrices;

the last three sub-block matrices ($P_1, P_2, P_3$) in the first column of the parity portion are identity matrices or permutation matrices and at least two of the last three matrices are the same, and the remaining sub-block matrices in the first column of the parity portion are zero matrices;

in the second last column of the parity portion, the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and the last two sub-block matrices ($P_7$) in the last column of the parity portion are the same, and are identity matrices or permutation matrices.

Each column from the second column to the third last column of the parity portion may contain only one identity matrix or permutation matrix below the upper diagonal, and the remaining sub-block matrices in the same column below the upper diagonal are zero matrices.

The permutation matrices may be cyclic-right-shifted identity matrices.

The system may further comprise a decoder to estimate the k data bits based on the received signals representing a codeword of k+m bits.

In a fifth aspect, there is provided a system for decoding data, the system comprising:

a decoder to estimate k data bits based on the received signals representing a codeword of k+m bits and a parity-check matrix (H), the parity-check matrix (H) including a data portion ($H_1$) and a parity portion ($H_2$), the parity portion ($H_2$) includes sub-block matrices, each sub-block matrix being any one from the group consisting of: zero matrix, identity matrix and permutation matrix;

wherein an upper diagonal is defined in the parity portion starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices;

each column from the second column to the third last column of the parity portion contains one or more identity matrices or permutation matrices below the upper diagonal, and the remaining sub-block matrices in the same column below the upper diagonal are zero matrices;

the last three sub-block matrices ($P_1$, $P_2$, $P_3$) in the first column of the parity portion are identity matrices or permutation matrices and at least two of the last three matrices are the same, and the remaining sub-block matrices in the first column of the parity portion are zero matrices;

in the second last column of the parity portion, the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and the last two sub-block matrices ($P_7$) in the last column of the parity portion are the same, and are identity matrices or permutation matrices.

Each column from the second column to the third last column of the parity portion may contain only one identity matrix or permutation matrix below the upper diagonal, and the remaining sub-block matrices in the same column below the upper diagonal are zero matrices.

The permutation matrices may be cyclic-right-shifted identity matrices.

The system may further comprise an encoder to form a codeword containing k data bits and m parity bits created from the k data bits.

BRIEF DESCRIPTION OF THE DRAWINGS

An example of the invention will now be described with reference to the accompanying drawings, in which:

FIG. 6 is a table showing column weights of the base parity-check matrix $H_b$ used to construct the A code and the B code of rate ½, and those for the rate ½ code used in the IEEE 802.16e standard;

FIG. 7 is a table showing row weights of the matrices $H_{b1}$, $H_{b2}$ and $H_b$ for the A code of FIG. 6;

FIG. 8 is a table showing row weights of the matrices $H_{b1}$, $H_{b2}$ and $H_b$ for the rate ½ code in the IEEE 802.16e standard;

FIG. 10 is a table of a worked example for the efficient encoding method according to an embodiment of the present invention;

FIG. 11 is a diagram of a modulo-2 addition operation for the encoding;

FIG. 12 is a diagram of a modulo-2 multiplication operation for the encoding;

FIG. 13 is a base parity-check matrix of the A code according to an embodiment of the present invention; and FIG. 14 is a base parity-check matrix of the B code according to an embodiment of the present invention.

DETAILED DESCRIPTION OF THE DRAWINGS

Figure 1:
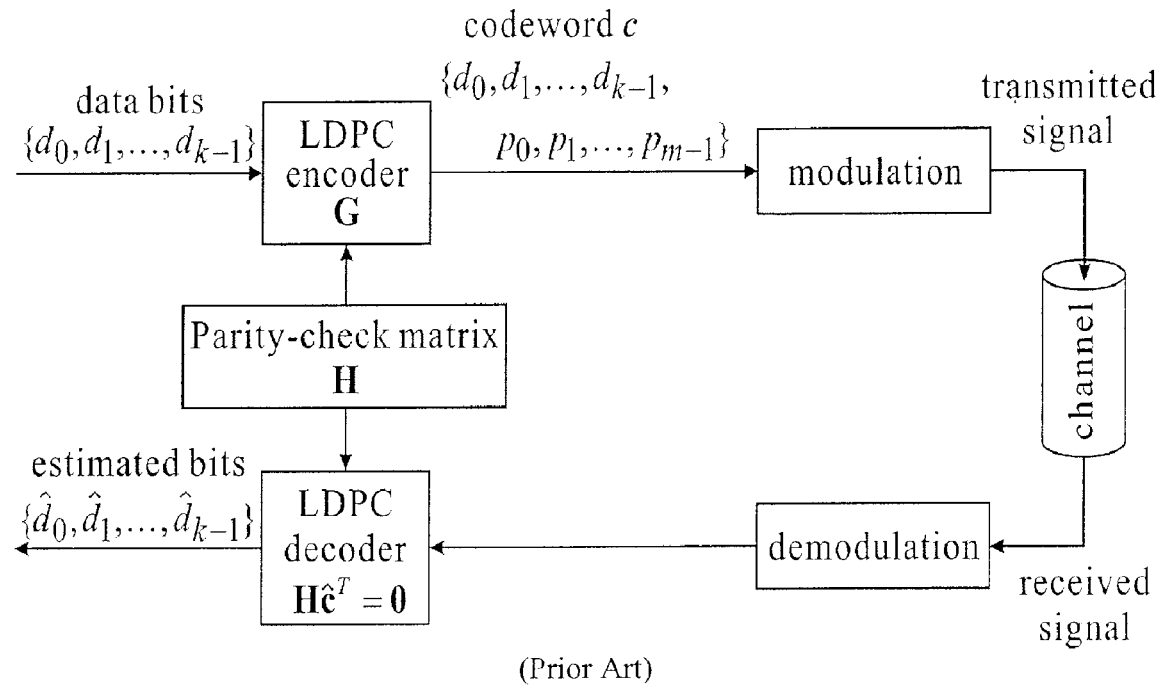
FIG. 1 is a block diagram illustrating a fundamental communication system using LDPC codes.
Figure 2:
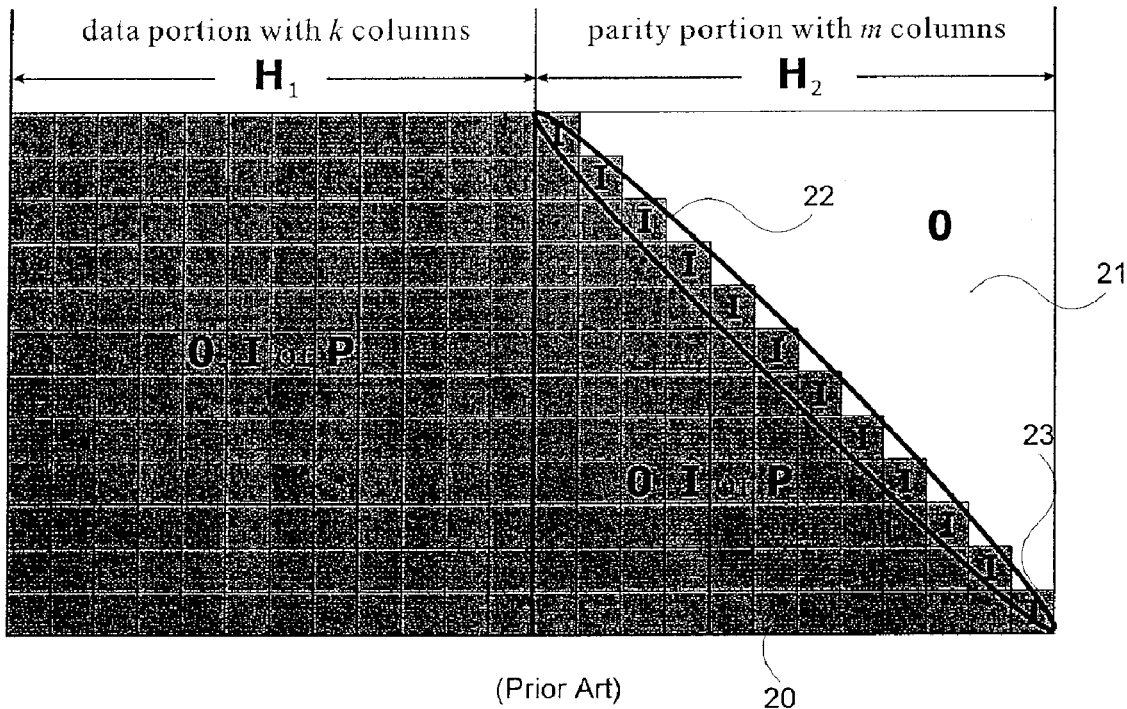
FIG. 2 is a structural diagram of an LDPC code consisting of sub-block matrices and represented by a parity-check matrix H=[$H_1$|$H_2$]. 0, I and P represent a zero matrix, an identity matrix and a permutation matrix, respectively.
Figure 3:
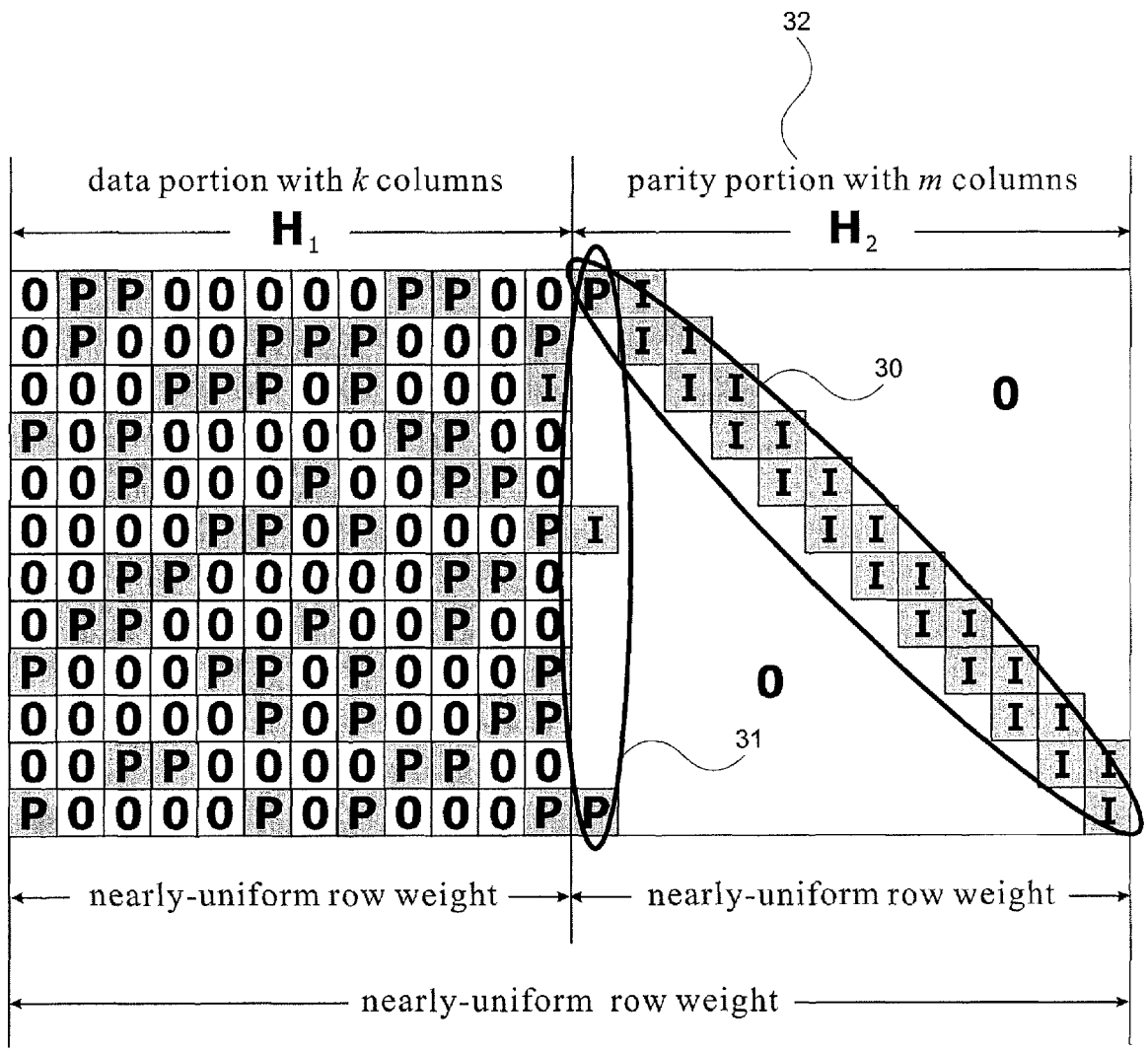
FIG. 3 is a structural diagram of the parity-check matrix H=[$H_1$|$H_2$] presented in IEEE 802.16e standard. 0, I and P represent a zero matrix, an identity matrix and a permutation matrix, respectively.
Figure 4:
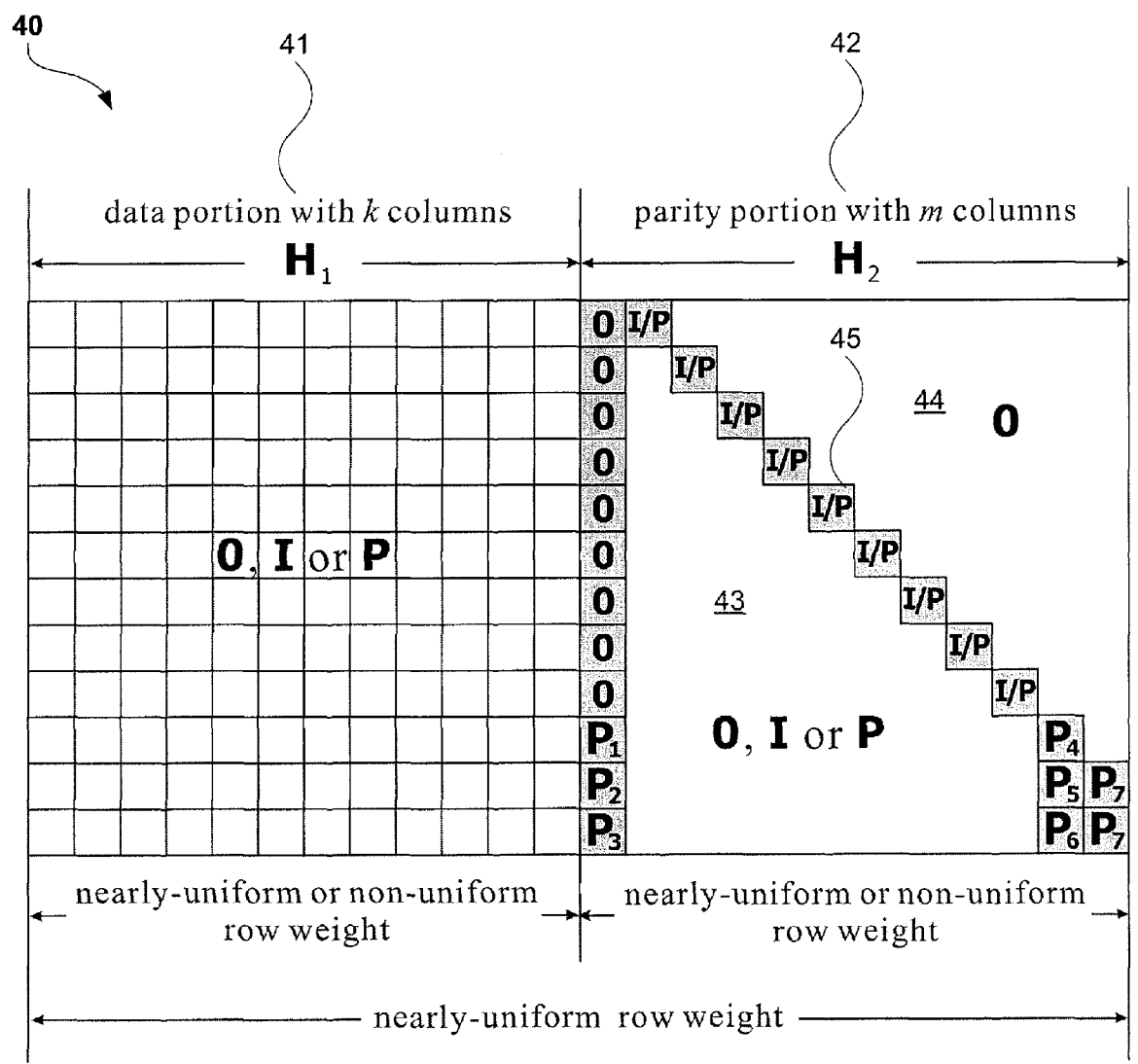
FIG. 4 is a structural diagram of a parity-check matrix H according to an embodiment of the present invention. 0, I and P represent a zero matrix, an identity matrix and a permutation matrix, respectively. $P_1$ to $P_4$ and $P_7$ are either identity matrices or permutation matrices, $P_5$ and $P_6$ are zero matrices, identity matrices or permutation matrices.

Referring to FIG. 4, a parity-check matrix H 40 is provided comprising a data portion $H_1$ 41 and a parity portion $H_2$ 42. The data portion 41 consists of k columns and the parity portion 42 consists of m columns. 0, I and P represent a zero matrix, an identity matrix and a permutation matrix, respectively. The permutation matrix may be a cyclic-right-shifted identity matrix. The first sub-block column in $H_2$ has a weight of three, and the last two sub-block columns of the parity portion $H_2$ has a weight of two. Each of the sub-block columns starting from the second column to the third last column of the parity portion has a weight of at least two. $P_1$ to $P_3$ are the three last sub-block matrices in the first sub-block column in the parity portion 42. $P_4$ to $P_6$ are the three last sub-block matrices in the second last sub-block column in the parity portion 42. $P_7$ are the two last sub-block matrices in the last sub-block column in the parity portion 42. $P_1$ to $P_4$ and $P_7$ are either identity matrices I or permutation matrices P. At least two out of the matrices $P_1$, $P_2$ and $P_3$ are the same. Also, $P_4$=$P_5$ and $P_6$=0, or $P_4$=$P_6$ and $P_5$=0. All of the sub-block matrices in the lower triangle 43 of $H_2$ can be assigned as zero matrices 0, identity matrices I or permutation matrices P, the generation of uniform or non-uniform row weights in $H_2$ is allowed. All of the sub-block matrices in the upper triangle 44 of the parity portion 42 are assigned as zero matrices 0. Depending on whether the row weight of the parity portion 42 is nearly-uniform or non-uniform, the row weight of the data portion 41 should also be nearly-uniform or non-uniform such that the row weights of the parity-check matrix H 40 can be maintained at nearly-uniform. A class of low-density parity-check (LDPC) codes is provided that can offer a better performance compared to the structure shown in FIG. 3. Also, the LDPC codes provided can achieve low encoding complexity.

Figure 5:
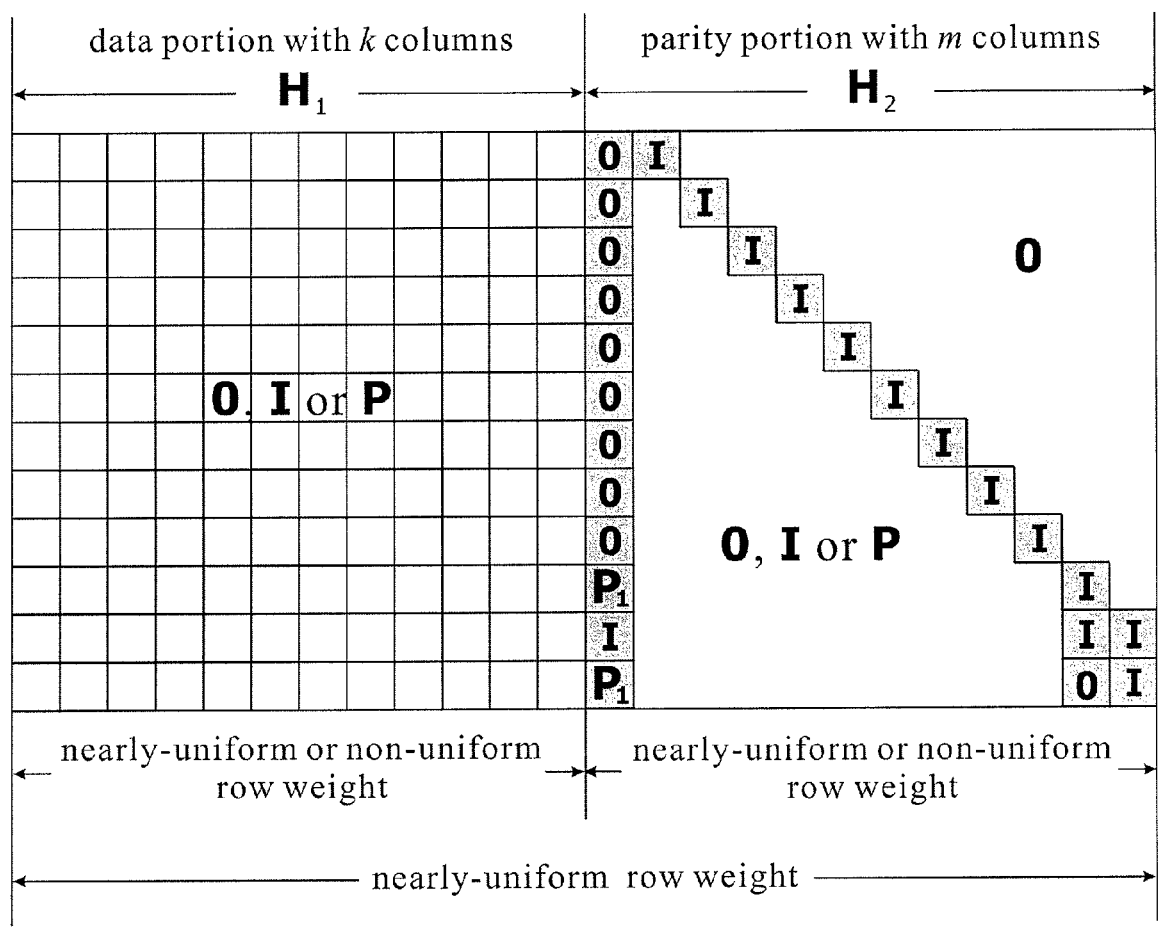
FIG. 5 is a structural diagram of a particular form of the parity-check matrix H according to an embodiment of the present invention.

Referring to FIG. 5, a specific form of the parity-check matrix H depicted in FIG. 4 is provided. Some of the sub-block matrices have been conveniently set to be identity matrices I. The changes from FIG. 4 are that $P_2$ is an identity matrix and $P_3$ is the same as $P_1$. Also, $P_4$, $P_5$ and $P_7$ are identity matrices and $P_6$ is a zero matrix.

An example with values is described. The code length is set as n=2304 and the expansion factor (the number of columns in a sub-block matrix) is set as z=96. The base parity-check matrix contains twelve rows and twenty-four columns for a rate ½ code. Two LDPC codes are constructed called the A code and the B code.

Referring to FIG. 6, the column weights of the base parity-check matrix $H_b$ used to construct the A code and the B code are tabulated. The column weights of the rate ½ code used in the IEEE 802.16e standard are also shown at the last row in the same table. The column weights of the A code and their order have been selected to be exactly the same as those of the rate ½ code used in the IEEE 802.16e standard.

Referring to FIG. 7, in the A code, the row weights of the matrices $H_{b1}$, $H_{b2}$ and $H_b$, where $H_b=[H_{b1}|H_{b2}]$, are tabulated. $H_{b1}$ is the data portion and $H_{b2}$ is the parity portion. For comparison, the row weights for the rate ½ code used in the IEEE 802.16e standard are tabulated in FIG. 8. In FIG. 8, the row weights of the matrices $H_{b1}$, $H_{b2}$ and $H_b$ of the IEEE 802.16e code are nearly-uniform. For each of the matrices $H_{b1}$, $H_{b2}$ and $H_b$, the row weights have only two values. In contrast, the row weights of $H_{b1}$ equal 1, 3, 4, 5 or 6 of the A code and are non-uniform. Similarly, the row weights of $H_{b2}$ range from 1 to 5 and are also non-uniform. However, $H_b$ has only two row-weight values: eight rows having row weights of six and four rows having row weights of seven. These row weights are close to being uniform. Although the order of the row weights of $H_b$ corresponding to the A code is different from that corresponding to the IEEE 802.16e code, the row-weight distributions for both codes are the same.

Figure 9:
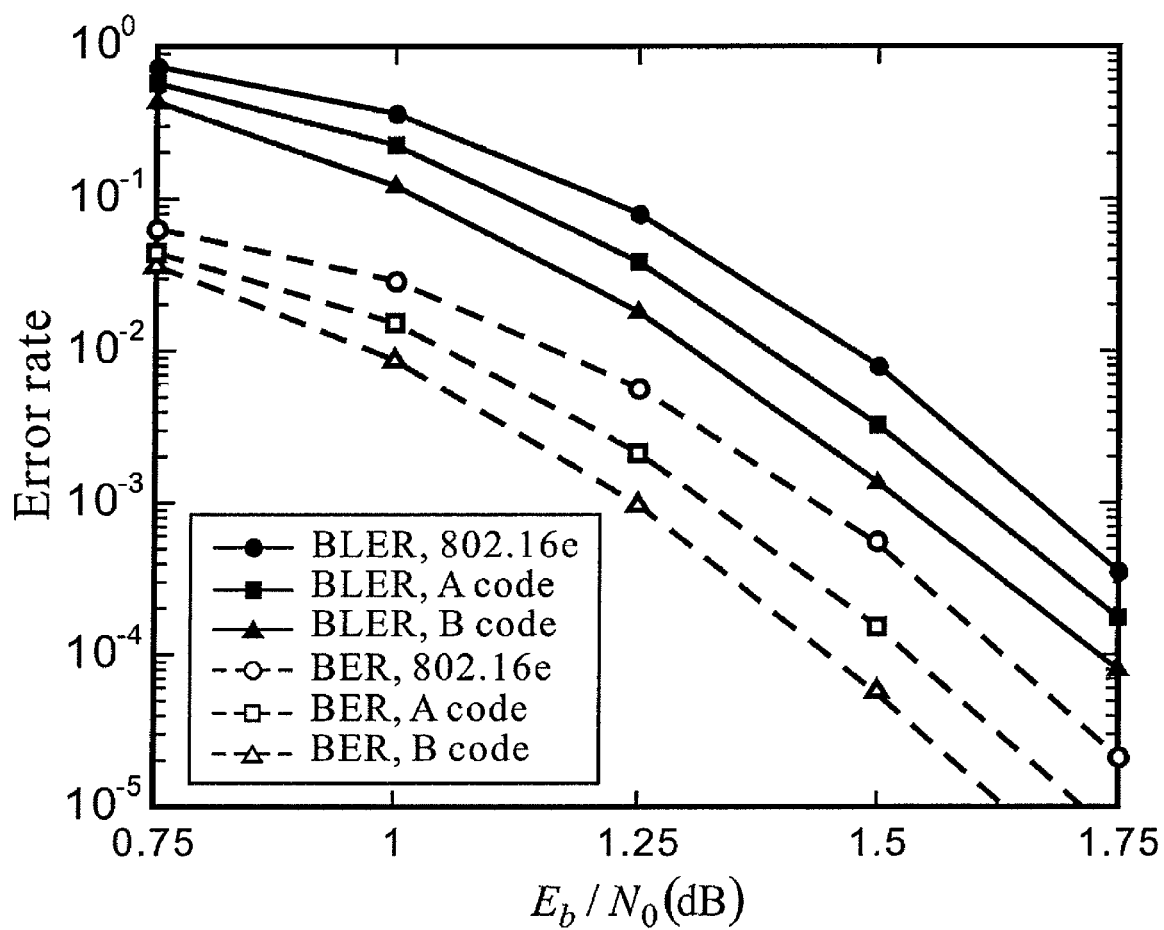
FIG. 9 is a chart of the block error rate (BLER) and the bit error rate (BER) for the LDPC A and B codes of FIG. 6 compared to the LDPC code presented in IEEE 802.16e standard.

Referring to FIG. 9, the error performance of the A and B codes of FIG. 6 are compared to the code of the IEEE 802.16e standard by applying an additive white Gaussian noise (AWGN) channel. To achieve a fair comparison, the same set of noise samples is used. The block error rate (BLER) and the bit error rate (BER) of the proposed A code, B code and the IEEE 802.16e code with ½ code rate is shown as the bit-energy-to-noise-power-spectral-density ratio ($E_b/N_0$) varies. The A code has the same column-weight and row-weight distributions as the IEEE 802.16e code. However, the A code has non-uniform row weights of $H_{b1}$ and $H_{b2}$ and outperforms the IEEE 802.16e code. The B code possesses a different column-weight distribution compared with the A code and the IEEE 802.16e code. The B code shows superior error performance over the A code and the IEEE 802.16e code.

A class of LDPC codes together with the encoding technique is provided that can be applied to the error correction in the IEEE 802.16e and the IEEE 802.11n standards for computer communications and wireless communications to achieve lower error rates. As the demand for wireless access is increasing, faster speed and more reliable communications is expected. The low-density-parity-check (LDPC) codes provided have good error performance and low encoding complexity which may be used as the error correcting codes for the IEEE 802.16 and IEEE 802.11 standards and also for any other wireless or wired communications standards.

An advantage of the LDPC codes provided is that they can provide better performance than the present technology adopted by the IEEE 802.16e and the IEEE 802.11n standards in terms of block error rate and bit error rate. A new approximate lower triangle (ALT) structure for the parity-check matrix 40 is provided which allows low encoding complexity. The parity part 42 of the parity-check matrix 40 is semi-deterministic. In the field of mathematics, a diagonal starts from the first element of the first column and extends to the last element of the last column. However, the upper diagonal 45 represents the elements immediately above the elements on the diagonal. For each column starting from the second column to the third last column of the parity portion 42, the sub-block matrix on the upper diagonal 45 is an identity or permutation sub-block matrix. Also, for each column starting from the second column to the third last column of the parity portion 42, at least one of the sub-block matrices 43 below the upper diagonal 45 is an identity or permutation sub-block matrix. All other sub-block matrices in the same column below the upper diagonal 45 are zero sub-block matrices. When compared with the typical dual-diagonal structure, the present invention can increase the design flexibility of the parity-check matrix 40. Under a similar encoding complexity, the present invention can also provide lower error rates than the dual-diagonal structure.

In another example, it is envisaged that for each of the columns starting from the second column to the third last column of the parity portion 42, the sub-block matrix on the upper diagonal 45 and only one of the sub-block matrices 43 below the upper diagonal 45 are identity or permutation sub-block matrices. All other sub-block matrices in the same column are zero sub-block matrices.

The row-weight distributions of the structure provided are considered. The optimum row-weights of the parity-check matrix H are found to be nearly-uniform. Traditionally, for block-structured LDPC codes, the row weights of both $H_1$ and $H_2$ are designed to be nearly-uniform, just like the row weights of the parity-check matrix H. In the present invention, however, the matrices $H_1$ and $H_2$ are allowed to have non-uniform row weights while the row weights of the matrix H are kept to be nearly-uniform. As a result, the design of the codes is more flexible.

An efficient encoding method is provided. The codeword vector c of length n is composed of k data bits and m parity bits, which is given by $(c)_n=[(d)_k|(p)_m]$ where $d=[d_0, d_1, \ldots, d_{k-1}]$ and $p=[p_0, p_1, \ldots, p_{m-1}]$ represent the data bits and the parity bits respectively.

An m×n parity-check matrix H can be expressed by:

$(H)_{m\times n}=[(H_1)_{m\times k}|(H_2)_{m\times m}]$ where $H_1$ is an m×k matrix corresponding to the data bits of the codeword, and $H_2$ is an m×m matrix corresponding to the parity bits.

The parity-check matrix H consisting of sub-block matrices is given by:

$$H = \begin{bmatrix} h_{0,0} & h_{0,1} & \cdots & h_{0,k_b-1} & h_{0,k_b} & \cdots & h_{0,n_b-1} \\ h_{1,0} & h_{1,1} & \cdots & h_{1,k_b-1} & h_{1,k_b} & \cdots & h_{1,n_b-1} \\ \vdots & \vdots & \ddots & \vdots & \vdots & \ddots & \vdots \\ h_{m_b-1,0} & h_{m_b-1,1} & \cdots & h_{m_b-1,k_b-1} & h_{m_b-1,k_b} & \cdots & h_{m_b-1,n_b-1} \end{bmatrix}$$

where z is the expansion factor, $n_b=n/z$, $k_b=k/z$ and $m_b=m/z$. $h_{i,j}$ (i=0, 1, 2, … $m_b$−1, j=0, 1, 2, … $n_b$−1) is an z×z square matrix, which can be a zero matrix, an identity matrix or a permutation matrix. Then, the codeword vector can be re-written as $c=[d_0 d_1 \ldots d_{k_b-1}|p_0 p_1 \ldots p_{m_b-1}]$ where $d_i$ and $p_i$ represent vectors of length z, which are given by $d_i=[d_{iz}\ d_{iz+1}\ \cdots\ d_{iz+z-1}]$ and $p_i=[p_{iz}\ p_{iz+1}\ \cdots\ p_{iz+z-1}]$ respectively.

The proposed parity-check matrix H can be expressed as $$H = \begin{bmatrix} h_{0,0} & h_{0,1} & \cdots & h_{0,k_b-1} & 0 & h_{0,k_b+1} & 0 & \cdots & 0 & 0 & 0 \\ h_{1,0} & h_{1,1} & \cdots & h_{1,k_b-1} & 0 & h_{1,k_b+1} & h_{1,k_b+2} & \cdots & 0 & 0 & 0 \\ h_{2,0} & h_{2,1} & \cdots & h_{2,k_b-1} & 0 & h_{2,k_b+1} & h_{2,k_b+2} & \cdots & 0 & 0 & 0 \\ \vdots & \vdots & \ddots & \vdots & \vdots & \vdots & \vdots & \ddots & \vdots & \vdots & \vdots \\ h_{m_b-4,0} & h_{m_b-4,1} & \cdots & h_{m_b-4,k_b-1} & 0 & h_{m_b-4,k_b+1} & h_{m_b-4,k_b+2} & \cdots & h_{m_b-4,k_b+m_b-3} & 0 & 0 \\ h_{m_b-3,0} & h_{m_b-3,1} & \cdots & h_{m_b-3,k_b-1} & P_1 & h_{m_b-3,k_b+1} & h_{m_b-3,k_b+2} & \cdots & h_{m_b-3,k_b+m_b-3} & P_4 & 0 \\ h_{m_b-2,0} & h_{m_b-2,1} & \cdots & h_{m_b-2,k_b-1} & P_2 & h_{m_b-2,k_b+1} & h_{m_b-2,k_b+2} & \cdots & h_{m_b-2,k_b+m_b-3} & P_5 & P_7 \\ h_{m_b-1,0} & h_{m_b-1,1} & \cdots & h_{m_b-1,k_b-1} & P_3 & h_{m_b-1,k_b+1} & h_{m_b-1,k_b+2} & \cdots & h_{m_b-1,k_b+m_b-3} & P_6 & P_7 \end{bmatrix}$$

The operation of the encoding is to find vectors $p_0$, $p_1, \ldots, p_{m_b-1}$ based on vectors $d_0, d_1, \ldots, d_{k_b-1}$ and the parity-check matrix H. Since $Hc^T = 0$, we have the following equations for each row of matrix H:

Row 0:

$$\sum_{j=0}^{k_b-1} h_{0,j} d_j + h_{0,k_b+1} p_1 = 0$$

Row 1:

$$\sum_{j=0}^{k_b-1} h_{1,j} d_j + h_{1,k_b+1} p_1 + h_{1,k_b+2} p_2 = 0$$

Row i, $2 \leq i \leq m_b - 4$:

$$\sum_{j=0}^{k_b-1} h_{i,j} d_j + \sum_{j=k_b+1}^{k_b+i} h_{i,j} p_{j-k_b} + h_{i,k_b+i+1} p_{i+1} = 0$$

Row $(m_b - 3)$:

$$\sum_{j=0}^{k_b-1} h_{m_b-3,j} d_j + P_1 p_0 + \sum_{j=k_b+1}^{k_b+m_b-3} h_{m_b-3,j} p_{j-k_b} + P_4 p_{m_b-2} = 0$$

Row $(m_b - 2)$:

$$\sum_{j=0}^{k_b-1} h_{m_b-2,j} d_j + P_2 p_0 + \sum_{j=k_b+1}^{k_b+m_b-3} h_{m_b-2,j} p_{j-k_b} + P_5 p_{m_b-2} + P_7 p_{m_b-1} = 0$$

Row $(m_b - 1)$:

$$\sum_{j=0}^{k_b-1} h_{m_b-1,j} d_j + P_3 p_0 + \sum_{j=k_b+1}^{k_b+m_b-3} h_{m_b-1,j} p_{j-k_b} + P_6 p_{m_b-2} + P_7 p_{m_b-1} = 0$$

First, $p_1$ is calculated using $$\sum_{j=0}^{k_b-1} h_{0,j} d_j + h_{0,k_b+1} p_1 = 0.$$

Next, $p_2$ is evaluated by substituting $p_1$ into $$\sum_{j=0}^{k_b-1} h_{1,j} d_j + h_{1,k_b+1} p_1 + h_{1,k_b+2} p_2 = 0.$$

With knowledge of $p_1$ to $p_i$ ($i = 2, 3, \ldots, m_b-4$), $p_{i+1}$ is solved using $$\sum_{j=0}^{k_b-1} h_{i,j} d_j + \sum_{j=k_b+1}^{k_b+i} h_{i,j} p_{j-k_b} + h_{i,k_b+i+1} p_{i+1} = 0.$$

Summing the terms for the last three rows, $p_0$ is obtained by using:

$$\sum_{i=m_b-3}^{m_b-1} \left( \sum_{j=0}^{k_b-1} h_{i,j} d_j + \sum_{j=k_b+1}^{k_b+m_b-3} h_{i,j} p_{j-k_b} \right) +$$
$$(P_1 + P_2 + P_3) p_0 + (P_4 + P_5 + P_6) p_{m_b-2} = 0$$

Finally, with knowledge of $p_0$ to $p_{m_b-3}$, $p_{m_b-2}$ is evaluated by using $$\sum_{j=0}^{k_b-1} h_{m_b-3,j} d_j + P_1 p_0 + \sum_{j=k_b+1}^{k_b+m_b-3} h_{m_b-3,j} p_{j-k_b} + P_4 p_{m_b-2} = 0$$

and $p_{m_b-1}$ by using $$\sum_{j=0}^{k_b-1} h_{m_b-2,j} d_j + P_2 p_0 + \sum_{j=k_b+1}^{k_b+m_b-3} h_{m_b-2,j} p_{j-k_b} + P_5 p_{m_b-2} + P_7 p_{m_b-1} = 0 \text{ or}$$

$$\sum_{j=0}^{k_b-1} h_{m_b-1,j} d_j + P_3 p_0 + \sum_{j=k_b+1}^{k_b+m_b-3} h_{m_b-1,j} p_{j-k_b} + P_6 p_{m_b-2} + P_7 p_{m_b-1} = 0.$$

A worked example is illustrated in FIG. 10. $p_1$ to $p_3$ can be obtained directly as follows:

$$p_1 = h_{0,0}d_0 + h_{0,3}d_3 \quad \text{(Row 0)}$$

$$p_2 = h_{1,4}d_4 + h_{1,5}d_5 \quad \text{(Row 1)}$$

$$p_3 = h_{2,0}d_0 + h_{2,2}d_2 + h_{2,7}p_1 \quad \text{(Row 2)}$$

Summing the terms related to Row 3 to Row 5 of H, the following is obtained:

$$(h_{3,1}d_1 + h_{3,3}d_3 + Pp_0 + p_4) + (h_{4,2}d_2 + p_0 + h_{4,9}p_3 + p_4 + p_5) + (h_{5,5}d_5 + Pp_0 + h_{5,8}p_2 + p_5) = 0$$

Then $p_0$ can be solved by:

$$p_0 = (h_{3,1}d_1 + h_{3,3}d_3) + (h_{4,2}d_2 + h_{4,9}p_3) + (h_{5,5}d_5 + h_{5,8}p_2)$$

Finally, $p_4$ and $p_5$ are evaluated by:

$$p_4 = h_{3,1}d_1 + h_{3,3}d_3 + Pp_0 \quad \text{(Row 3)}$$

$$p_5 = h_{5,5}d_5 + Pp_0 + h_{5,8}p_2 \quad \text{(Row 5)}$$

Therefore $p_0$ to $p_5$ have all been obtained.

Referring to FIGS. 11 and 12, all additions and multiplications in the equations described earlier are computed using modulo-2 operations. In FIG. 11, the addition of two equal bits $\{0, 0\}$ or $\{1, 1\}$ is zero, while it is one for two unequal bits $\{0, 1\}$ and $\{1, 0\}$. In FIG. 12, except the multiplication of two bits $\{1, 1\}$ that gives one, the results for the other three cases are all zeros.

Referring to FIGS. 13 and 14, details of the base matrices for the A code and B code of FIG. 6 are illustrated. The "−1" in the base matrix corresponds to the zero matrix. The "0" corresponds to the identity matrix. All non-zero values represent different "P" permutation matrices.

It will be appreciated by persons skilled in the art that numerous variations and/or modifications may be made to the invention as shown in the specific embodiments without departing from the scope or spirit of the invention as broadly described. The present embodiments are, therefore, to be considered in all respects illustrative and not restrictive.

We claim:

1. A method for encoding data, the method comprising:
   creating m parity bits from k data bits based on a parity-check matrix (H), the parity-check matrix (H) including a data portion ($H_1$) and a parity portion ($H_2$), the parity portion ($H_2$) includes sub-block matrices, each sub-block matrix being any one from the group consisting of: zero matrix, identity matrix and permutation matrix; and
   forming a codeword containing the k data bits and the created m parity bits;
   wherein an upper diagonal is defined in the parity portion starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices;
   each column from the second column to the third last column of the parity portion contains one or more identity matrices or permutation matrices below the upper diagonal, and the remaining sub-block matrices in the same column below the upper diagonal are zero matrices;
   the last three sub-block matrices ($P_1$, $P_2$, $P_3$) in the first column of the parity portion are identity matrices or permutation matrices and at least two of the last three matrices are the same, and the remaining sub-block matrices in the first column of the parity portion are zero matrices;
   in the second last column of the parity portion, the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and
   the last two sub-block matrices ($P_7$) in the last column of the parity portion are the same, and are identity matrices or permutation matrices.

2. The method according to claim 1, wherein each column from the second column to the third last column of the parity portion contains only one identity matrix or permutation matrix below the upper diagonal, and the remaining sub-block matrices in the same column below the upper diagonal are zero matrices.

3. The method according to claim 1, wherein the permutation matrices are cyclic-right-shifted identity matrices.

4. A method for computing m parity bits using k data bits and a parity-check matrix (H) including a data portion ($H_1$) and a parity portion ($H_2$) by finding vectors $p_0, p_1, \ldots, p_{m_b-1}$ each of length z based on vectors $d_0, d_1, \ldots, d_{k_b-1}$ each of length z, where $m_b$ is equal to m divided by z, and $k_b$ is equal to k divided by z, the parity-check matrix (H) having the following structure:

$$H = \begin{bmatrix} h_{0,0} & h_{0,1} & \cdots & h_{0,k_b-1} & 0 & h_{0,k_b+1} & 0 & \cdots & 0 & 0 & 0 \\ h_{1,0} & h_{1,1} & \cdots & h_{1,k_b-1} & 0 & h_{1,k_b+1} & h_{1,k_b+2} & \cdots & 0 & 0 & 0 \\ h_{2,0} & h_{2,1} & \cdots & h_{2,k_b-1} & 0 & h_{2,k_b+1} & h_{2,k_b+2} & \cdots & 0 & 0 & 0 \\ \vdots & \vdots & \ddots & \vdots & \vdots & \vdots & \vdots & \ddots & \vdots & \vdots & \vdots \\ h_{m_b-4,0} & h_{m_b-4,1} & \cdots & h_{m_b-4,k_b-1} & 0 & h_{m_b-4,k_b+1} & h_{m_b-4,k_b+2} & \cdots & h_{m_b-4,k_b+m_b-3} & 0 & 0 \\ h_{m_b-3,0} & h_{m_b-3,1} & \cdots & h_{m_b-3,k_b-1} & P_1 & h_{m_b-3,k_b+1} & h_{m_b-3,k_b+2} & \cdots & h_{m_b-3,k_b+m_b-3} & P_4 & 0 \\ h_{m_b-2,0} & h_{m_b-2,1} & \cdots & h_{m_b-2,k_b-1} & P_2 & h_{m_b-2,k_b+1} & h_{m_b-2,k_b+2} & \cdots & h_{m_b-2,k_b+m_b-3} & P_5 & P_7 \\ h_{m_b-1,0} & h_{m_b-1,1} & \cdots & h_{m_b-1,k_b-1} & P_3 & h_{m_b-1,k_b+1} & h_{m_b-1,k_b+2} & \cdots & h_{m_b-1,k_b+m_b-3} & P_6 & P_7 \end{bmatrix}$$

the method comprising:
calculating $p_1$ using the equation:

$$\sum_{j=0}^{k_b-1} h_{0,j}d_j + h_{0,k_b+1}p_1 = 0$$

calculating $p_2$ using the equation:

$$\sum_{j=0}^{k_b-1} h_{1,j}d_j + h_{1,k_b+1}p_1 + h_{1,k_b+2}p_2 = 0$$

calculating $p_{i+1}$ using the equation for $2 \leq i \leq m_b - 4$:

$$\sum_{j=0}^{k_b-1} h_{i,j} d_j + \sum_{j=k_b+1}^{k_b+i} h_{i,j} p_{j-k_b} + h_{i,k_b+i+1} p_{i+1} = 0$$

calculating $p_0$ by using the equation:

$$\sum_{i=m_b-3}^{m_b-1} \left( \sum_{j=0}^{k_b-1} h_{i,j} d_j + \sum_{j=k_b+1}^{k_b+m_b-3} h_{i,j} p_{j-k_b} \right) +$$

$$(P_1 + P_2 + P_3) p_0 + (P_4 + P_5 + P_6) p_{m_b-2} = 0$$

calculating $p_{m_b-2}$ using the equation:

$$\sum_{j=0}^{k_b-1} h_{m_b-3,j} d_j + P_1 p_0 + \sum_{j=k_b+1}^{k_b+m_b-3} h_{m_b-3,j} p_{j-k_b} + P_4 p_{m_b-2} = 0; \text{ and}$$

calculating $p_{m_b-1}$ using the equation:

$$\sum_{j=0}^{k_b-1} h_{m_b-2,j} d_j + P_2 p_0 + \sum_{j=k_b+1}^{k_b+m_b-3} h_{m_b-2,j} p_{j-k_b} + P_5 p_{m_b-2} + P_7 p_{m_b-1} = 0;$$

wherein each element of the parity-check matrix is a sub-block matrix of size z by z, and is any one from the group consisting of: zero matrix, identity matrix and permutation matrix; the data portion ($H_1$) is composed of the first $k_b$ columns of the parity-check matrix (H) and the parity portion ($H_2$) is composed of the remaining $m_b$ columns of the parity-check matrix (H);

an upper diagonal is defined in the parity portion ($H_2$) starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices; and each column from the second column to the third last column of the parity portion contains one or more identity matrices or permutation matrices below the upper diagonal, and the remaining sub-block matrices in the same column below the upper diagonal are zero matrices.

5. The method according to claim 4, wherein $p_{m_b-1}$ is calculated using the equation:

$$\sum_{j=0}^{k_b-1} h_{m_b-1,j} d_j + P_3 p_0 + \sum_{j=k_b+1}^{k_b+m_b-3} h_{m_b-1,j} p_{j-k_b} + P_6 p_{m_b-2} + P_7 p_{m_b-1} = 0.$$

6. The method according to claim 4, wherein the parity-check matrix (H) is created by:
   assigning identity matrices or permutation matrices to the last three sub-block matrices ($P_1$, $P_2$, $P_3$) in the first column of the parity portion ($H_2$) such that at least two of the last three sub-block matrices are the same;
   assigning an identity matrix or a permutation matrix to each sub-block matrix on the upper diagonal in the parity portion ($H_2$);
   assigning an identity matrix or a permutation matrix to at least one of the sub-block matrices below the upper diagonal for each of the columns starting from the second column to the third last column of the parity portion ($H_2$);
   assigning identity matrices or permutation matrices to the last three sub-block matrices in the second last column of the parity portion ($H_2$) such that the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and
   assigning the last sub-block matrix in the last column of the parity portion ($H_2$) to be the same as the second last sub-block matrix; and
   assigning zero matrices to all the remaining sub-block matrices in the parity portion ($H_2$); and
   assigning a zero matrix, an identity matrix or a permutation matrix to each of the sub-block matrices in the data portion ($H_1$).

7. The method according to claim 4, wherein an identity matrix or a permutation matrix is assigned to only one of the sub-block matrices below the upper diagonal for each of the columns starting from the second column to the third last column of the parity portion ($H_2$).

8. The method according to claim 4, wherein the permutation matrices are cyclic-right-shifted identity matrices.

9. A method for decoding data, the method comprising:
   receiving signals representing a codeword of k+m bits;
   decoding the k data bits using a parity-check matrix (H), the parity-check matrix including a data portion ($H_1$) and a parity portion ($H_2$), the parity portion ($H_2$) includes sub-block matrices, each sub-block matrix being any one from the group consisting of: zero matrix, identity matrix and permutation matrix;
   wherein an upper diagonal is defined in the parity portion starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices;
   each column from the second column to the third last column of the parity portion contains one or more identity matrices or permutation matrices below the upper diagonal, and the remaining sub-block matrices in the same column below the upper diagonal are zero matrices;
   the last three sub-block matrices ($P_1$, $P_2$, $P_3$) in the first column of the parity portion are identity matrices or permutation matrices and at least two of the last three matrices are the same, and the remaining sub-block matrices in the first column of the parity portion are zero matrices;
   in the second last column of the parity portion, the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and
   the last two sub-block matrices ($P_7$) in the last column of the parity portion are the same, and are identity matrices or permutation matrices.

10. The method according to claim 9, wherein each column from the second column to the third last column of the parity portion contains only one identity matrix or permutation matrix below the upper diagonal, and the remaining sub-block matrices in the same column below the upper diagonal are zero matrices.

11. The method according to claim 9, wherein the permutation matrices are cyclic-right-shifted identity matrices.

12. A system for encoding data, the system comprising:
an encoder to form a codeword containing k data bits and m parity bits created from the k data bits based on a parity-check matrix (H), the parity-check matrix (H) including a data portion ($H_1$) and a parity portion ($H_2$), the parity portion ($H_2$) includes sub-block matrices, each sub-block matrix being any one from the group consisting of: zero matrix, identity matrix and permutation matrix;
wherein an upper diagonal is defined in the parity portion starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices;
each column from the second column to the third last column of the parity portion contains one or more identity matrices or permutation matrices below the upper diagonal, and the remaining sub-block matrices in the same column below the upper diagonal are zero matrices;
the last three sub-block matrices ($P_1$, $P_2$, $P_3$) in the first column of the parity portion are identity matrices or permutation matrices and at least two of the last three matrices are the same, and the remaining sub-block matrices in the first column of the parity portion are zero matrices;
in the second last column of the parity portion, the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and
the last two sub-block matrices ($P_7$) in the last column of the parity portion are the same, and are identity matrices or permutation matrices.

13. The system according to claim 12, wherein each column from the second column to the third last column of the parity portion contains only one identity matrix or permutation matrix below the upper diagonal, and the remaining sub-block matrices in the same column below the upper diagonal are zero matrices.

14. The system according to claim 12, wherein the permutation matrices are cyclic-right-shifted identity matrices.

15. The system according to claim 12, further comprising a decoder to estimate the k data bits based on the received signals representing a codeword of k+m bits.

16. A system for decoding data, the system comprising:
a decoder to estimate k data bits based on the received signals representing a codeword of k+m bits and a parity-check matrix (H), the parity-check matrix (H) including a data portion ($H_1$) and a parity portion ($H_2$), the parity portion ($H_2$) includes sub-block matrices, each sub-block matrix being any one from the group consisting of: zero matrix, identity matrix and permutation matrix;
wherein an upper diagonal is defined in the parity portion starting from the first sub-block matrix in the second column extending to the second last sub-block matrix in the last column, and each sub-block matrix on the upper diagonal is an identity matrix or a permutation matrix, and the sub-block matrices above the upper diagonal are zero matrices;
each column starting from the second column to the third last column of the parity portion contains one or more identity matrices or permutation matrices below the upper diagonal, and the remaining sub-block matrices in the same column below the upper diagonal are zero matrices;
the last three sub-block matrices ($P_1$, $P_2$, $P_3$) in the first column of the parity portion are identity matrices or permutation matrices and at least two of the last three matrices are the same, and the remaining sub-block matrices in the first column of the parity portion are zero matrices;
in the second last column of the parity portion, the third last sub-block matrix ($P_4$) is equal to the second last sub-block matrix ($P_5$) and the last sub-block matrix ($P_6$) is a zero matrix, or the third last sub-block matrix ($P_4$) is equal to the last sub-block matrix ($P_6$) and the second last sub-block matrix ($P_5$) is a zero matrix; and
the last two sub-block matrices ($P_7$) in the last column of the parity portion are the same, and are identity matrices or permutation matrices.

17. The system according to claim 16, wherein each column starting from the second column to the third last column of the parity portion contains only one identity matrix or permutation matrix below the upper diagonal, and the remaining sub-block matrices in the same column below the upper diagonal are zero matrices.

18. The system according to claim 16, wherein the permutation matrices are cyclic-right-shifted identity matrices.

19. The system according to claim 16, further comprising an encoder to form a codeword containing k data bits and m parity bits created from the k data bits.

* * * * *